United States Patent [19]

Winkelmann

[11] Patent Number: 4,988,591

[45] Date of Patent: Jan. 29, 1991

[54] PROCESS FOR PRODUCING COLOR IMAGES

[75] Inventor: Detlef Winkelmann, Wiesbaden, Fed. Rep. of Germany

[73] Assignee: Hoechst Aktiengesellschaft, Frankfurt am Main, Fed. Rep. of Germany

[21] Appl. No.: 347,407

[22] Filed: May 4, 1989

[30] Foreign Application Priority Data

May 6, 1988 [DE] Fed. Rep. of Germany ....... 3815538

[51] Int. Cl.$^5$ ............................................. G03G 13/01
[52] U.S. Cl. ...................................... 430/43; 430/126
[58] Field of Search ....................... 430/98, 43, 44, 45, 430/47, 126

[56] References Cited

U.S. PATENT DOCUMENTS

| | | | |
|---|---|---|---|
| 2,297,691 | 10/1942 | Carlson | 430/31 |
| 3,985,664 | 10/1976 | Sakaguchi et al. | 252/62.1 R |
| 4,049,477 | 9/1977 | Ligon | 148/187 |
| 4,149,798 | 4/1979 | McGowan et al. | 355/8 |
| 4,155,637 | 5/1979 | Witte et al. | 354/318 |
| 4,286,031 | 8/1981 | Kuehnle et al. | 430/47 |
| 4,863,543 | 9/1989 | Shiozawa et al. | 430/126 |

FOREIGN PATENT DOCUMENTS

| | | |
|---|---|---|
| 3709535 | 10/1987 | Fed. Rep. of Germany . |
| 1597986 | 9/1981 | United Kingdom . |
| 2189036 | 10/1987 | United Kingdom . |

*Primary Examiner*—David Welsh
*Attorney, Agent, or Firm*—Foley & Lardner, Schwartz, Jeffery, Schwaab, Mack, Blumenthal & Evans

[57] ABSTRACT

A process for producing color images electrophotographically by means of toner image transfer, wherein toner images of different colors are successively transferred to an adhesive layer with application of pressure, is disclosed. The process produces colored copy true to the original, and is particularly useful for producing images for film proofing methods.

16 Claims, 2 Drawing Sheets

PROCESS FOR PRODUCING COLOR IMAGES

BACKGROUND OF THE INVENTION

The invention relates to a process for producing color images electrophotographically by means of toner image transfer. Color images are here to be understood generally as multi-colored representations, and in particular the reproduction, true to the original, of colored copy. Above all, these also include color images for color proofing methods.

Color proofing methods or color proofing systems are an aid in color printing. As a rule, color printing is here to be understood as four-color printing. They are used at various points in the production process of a color print: for checking the reproduction-photographic steps in the preparation of the color separation films, as samples or approval basis for the color printing client and as an orientation aid for the printer on the printing press.

Color proofing systems are mainly used in gravure printing and offset printing, and to a small extent in flexographic printing. They use the screened color separations of the colored original, such as are required for producing printing plates in individual colors.

Mainly photochemically operating color proofing methods are known. Currently the most widely used system uses a laminate, in which tacky monomers are photopolymerized imagewise and thus lose their adhesive holding power. Dry color pigments adhere to the areas which have remained tacky. For each color, a laminate film is applied, exposed and tonered. In other laminate processes, UV-light sensitive colored layers are transferred to a carrier material, exposed on the latter and decoated in the non-image areas or, depending on the process, in the image areas. There are also photochemically operating overlay systems, in which UV-light sensitive color films become transparent after contact exposure with the color separations and after decoating of the image-free areas. When superposed in the precise register, they give a visual impression of the colored original.

Electrophotography is also used for producing color images. Most important are here in most cases color copiers which, however, do not have to meet the stringent demands of color proofing method with respect to correct color reproduction and the degree of image resolution. Dry toner developers are preferably used here. For some time, however, electrophotographically operating color proofing systems have also been offered and used. These use liquid developers. The electrophotographic color proofing methods hitherto disclosed conventionally operate with superposition of the toner images of the individual color separations. This is effected either via a temporary support or directly on the photoconductor layer. It is also known to copy all the color separations one on top of the other onto a photoconductor layer and to transfer them from the latter onto the final receiving material. Electrophotographically operating systems are also known in which exposure of the photoconductor is carried out by means of a laser digitally controlled with the phases of the image information.

Liquid developers are used in the hitherto disclosed, electrophotographically operating color proofing systems for the reason that their toner particles have a small particle size of less than 1 $\mu$m as a rule. In this way, a very high resolving power is achieved. A disadvantage is, however, that an insulating dispersant, as a rule a branched liquid hydrocarbon, must be employed, the evaporation of which involves environmental problems. Moreover, the possible high resolution of the liquid developer does not manifest itself whenever other process steps, such as imaging itself or the transfer of the toner, are of lower quality. Frequently, high resolution, which would require particles of less than 1 $\mu$m, is also not necessary. This is the case particularly if the printing plates for color printing are produced not by contact copying using film originals, but directly from an opaque original by optical imaging via a lens. This applies, for example, in the production of newspapers, where a relatively large number of plates must be produced within a short time. 48's screens are used here as a maximum (48 image elements per cm). As a rule, however, the screen is markedly coarser. Because of the great increase in colored images in newspapers, the question of an adequate color proofing system is here particularly acute. Even in poster printing, where colored reproduction predominates, a trend towards filmless plate production can be observed. In this case, the screen is even substantially coarser, but the formats are very large.

A color proofing system suitable for these user groups must be quick, reliable and inexpensive, but it must also allow processing of very large formats. By contrast, the resolution does not necessarily have to meet the most stringent requirements. The property patterns of the conventional electrophotographic toner image transfer processes do not meet these requirements.

When toner is transferred from the photoconductor layer to a receiving material or to a temporary support and from the latter to the receiving material, this must be done in precise register in the case of color images, so that the correct color impression is created. Moreover, defined quantities of toner must be transferred, since otherwise the depth of the corresponding colors is incorrect. In a conventional electrostatic transfer, especially when dry developers are used, the toner already transferred affects the transfer of the subsequent toner.

As an effective and evenly operating transfer principle, it is known to bring a two-dimensional material having a tacky surface into contact with the toner image located on the photoconductor layer. Since the non-image areas are then still tacky, the copy thus obtained can then be used only for restricted purposes. A variant is known in which the toner image is heated on the temporary support and the toner is then transferred in the molten state onto a final receiving material. The temporary support must here meet the requirement that it has the least possible interaction with the toner, so that the process becomes repeatable without disturbance. The toner must thus not be pressed into the temporary support.

It is also known to press toner images from dry developers into the receiving material by means of pressure. This is done mainly with one-component magnetic materials and with zinc oxide papers. However, because of the relatively low copy quality, this process has lost importance.

SUMMARY OF THE INVENTION

Accordingly, it is an object of the present invention to provide a process, based on electrophotography, by means of which color images, in particular four-color images, can be produced.

Another object of the present invention is to provide a process for producing reproductions of colored copy which are true to the original.

A further object of the present invention is to provide a process which allows the use of dry developer and by means of which even large formats can be imaged.

Yet another object of the present invention is to provide a process the quality of which matches the requirements of newspaper printing and poster printing.

In accomplishing the foregoing objectives, there has been provided, in accordance with one aspect of the present invention, a process for producing color images electrophotographically by means of toner image transfer, which comprises the steps of providing an adhesive material comprising a base and an adhesive layer, and transferring a plurality of toner images of different colors successively from a photoconductor to the adhesive layer with application of pressure.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The invention may be more readily understood by referring to the accompanying drawings in which.

DETAILED DESCRIPTION OF PREFERRED EMBODIMENTS

In the process according to the invention, the monochrome part components of a colored original are imaged in successive cycles, identical in each case, on a charged photoconductor layer, and the resulting charge images are developed by means of toner in the corresponding colors, whereupon toner images are transferred in precise register onto a two-dimensional receiving material. The colored toner images are successively transferred under pressure onto a two-dimensional receiving material which carries an adhesive layer.

As a rule, the process starts with four-color images, that is to say yellow, cyan, magenta and black color separations are available.

Four separate color tone images are completely transferred if the transfer pressure is sufficiently high and if the tackiness properties and flow properties of the receiving adhesive layer are matched to the pressure.

For fixing the conditions for the transfer, the following must be taken into account: the dry toner layer covering the photoconductor surface has a weight per unit area of up to 5 g/m². In the case of conventional dry toner, these are, depending on the particle size of the toner, 1 up to a maximum of 3 plies of unfixed toner. On fixing, the latter coalesces to form a closed layer of about 5 μm. It is obvious that an adhesive layer of approximately the same thickness can take up four times as much toner only if it is extremely tacky and flowable or if its components are able by themselves to make the pressed-in toner tacky. By contrast, an adhesive layer of about 20 μm thickness can be markedly less tacky and flowable in order to take up approximately the same quantity of toner. Accordingly, in the process with four-fold toner content, the preferred layer thickness of the adhesive layer is in the range between about 15 and 30 μm. Smaller and larger layer thicknesses can also be used but, for example, the upper limit depends on how similar the proof is intended to be to the actual four-color print. According to the invention, an adhesive layer is used which has a thickness of about 4 to 40 μm.

With respect to matching of the transfer pressure and the layer properties, it must also be taken into account that the devices used for multiple toner transfer must be appropriate to practice, in particular with regard to size and weight. A preferred form of applying the pressure between the photoconductor layer carrying a toner image and the receiving adhesive layer is to pass the layer pack through a pair of rollers which are under pressure. Since an exact determination of the area in the roller nip, on which the force acts, is difficult, the force acting on the length is indicated. For widths up to 30 cm (DIN A3 short side), commercially available pressure roller fixing devices known from electrophotographic office copiers can be used. These are constructed from two or three rollers which are under spring pressure and have a diameter of up to 100 mm.

Figure 1:
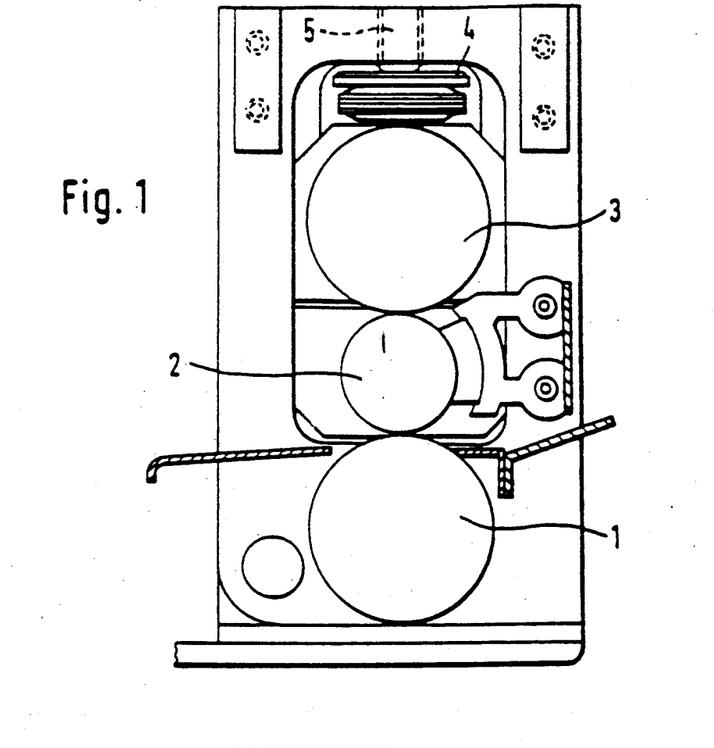
FIG. 1 is a sectional view of a three-roller print fixing device useful in practicing a preferred embodiment of the present invention.

Thus, referring to FIG. 1, a three-roller print fixing device in section is shown. Using this, a linear pressure of up to about 400 N/cm can be built up. The layer pack passes the gap between the rollers 1 and 2. Roller 1 is fixed, but rollers 2 and 3 are arranged to be mobile. They are pressed by the force of the spring 4 onto the roller 1. The spring can in turn be adjusted by means of the bolt 5. The device has a mass of about 10 kg. Towards greater working widths, however, the rollers would have to become thicker and the mass would rise more than proportionally and amount to approximately 100 kg at a working width of about 1000 mm. Moreover, there is a risk of creases being formed in the case of large formats and high linear pressure. For formats having a short side of 1000 mm and more, devices which apply a lower linear pressure are therefore preferred for carrying out the process.

With regard to the mechanical structure, a device is suitable here, for example, such as has been described in German Auslegeschrift No. 2,729,523, corresponding to U.S. Pat. No. 4,155,637, for another purpose. It operates with relatively thin and correspondingly light rollers. Their sag is compensated by support rollers fitted at defined points and by a blade which extends over the entire width and is under a contact pressure. In this way, a linear pressure of 20 N/cm can be achieved. Corresponding to the lower pressure, the tackiness and softness of the receiving material must be markedly greater, when such a device is used, than in the first-described case of the rollers exerting a higher pressure. In that case, all the toner is no longer transferred from the photoconductor layer. Rather, only the upper toner ply is taken off, but this does not reduce the feasibility of the process. If the photoconductor layer is to be re-used, it must then be freed of residual toner by cleaning.

In the process according to the invention, a pair of rollers, which exerts a linear pressure in the range from about 10 N/cm to 200 N/cm, is used for the toner transfer from the photoconductor to the adhesive layer. It is a variant of the process according to the invention to take off one ply of the toner image with only slight pressure and, in a second step, to press the toner into the adhesive layer under a higher pressure. This is of advantage particularly if the photoconductor layer is to be used repeatedly. Otherwise, there is a risk of the photoconductor layer and its base being damaged in the case of a high linear pressure.

Depending on the pressure under which toner images are transferred and how tacky and thick the receiving layer is, the multi-colored toner image is resistant to wiping or chalks off. If it is resistant to wiping, the layer is sometimes still tacky in the image-free areas. The color image obtained by multiple toner transfer to an adhesive layer is therefore as a rule not the final form. The latter is produced only by further process steps. These in turn depend on whether an opaque or a transparent carrier material is used as the final receiving material for the color image to be produced.

If opaque material is used as the base for the adhesive layer and the toners applied thereto, the image is viewable only in reflection. To ensure a read-right image, the original must be reproduced as a mirror image on the photoconductor layer. If the image still chalks off or is tacky, a spray lacquer can be applied in a known manner for covering. It is to be preferred, however, to apply a thin transparent layer by means of a film. It can be composed of a thin transparent carrier with a thin adhesive layer, or the layer on the film can be photochemically reactive in a known manner, so that it must be subjected to an UV exposure after it has been laminated on, and the transparent base can then be peeled off.

It is preferred, however, to produce a readright image of the color separations on the photoconductor layer, so that a read-wrong color image is obtained on the final receiving material. The latter must then be viewed through a transparent carrier layer, or it is transferred to a final receiving material on which a read-right image is then seen in reflection.

If the base of the adhesive layers is transparent and the latter are very tacky, the base and adhesive layer together with the image can be stuck to another two-dimensional material. If the remaining tackiness of the adhesive layers carrying the toner image is insufficient, the material pressed against them can also carry an adhesive layer. This two-dimensional material can be opaque or transparent. It is an advantageous process variant to exploit the fact that the adhesive strength of the adhesive layer increases with rising temperature. The adhesive layer carrying the multi-color toner image can therefore, especially if a hot-melt adhesive is used, be ironed onto the two-dimensional final receiving material by means of heat. As a rule, the toner is thus melted, so that its adhesive strength likewise becomes effective. If the adhesive layer and toner mix in the molten state, the multi-color toner image becomes transparent. A transparent color image is thus formed on a likewise transparent counter-material.

It is a particularly advantageous and therefore also a preferred procedure to transfer the colored toner image together with the adhesive layer thermally to the two-dimensional final receiving material and to peel off the original carrier of the adhesive layer. For this purpose, the adhesion between the adhesive layer and carrier must not be unduly high. According to the state of the art, this can be adapted to the requirements by applying a release coat directly to the carrier. After transferring, the tacky receiving layer comes to the top. Its tackiness must accordingly be eliminated again, so that the image becomes dry to the touch. In order to achieve this, the adhesive layer can consist of two plies, and the layer which is on the outside after the transfer to the final receiving material is the inner layer on the original carrier and is a hot-melt adhesive which does not stick at room temperature. Both the layers together should not be thicker than 20 μm, if possible, so that the character of the receiving material, that is to say the printing paper sheet, is changed as little as possible. This aim can also be achieved by making the adhesive layer photochemically reactive. Known formulations, such as are known, for example, from flexographic printing layers or dry resists, can be used. After the adhesive layer carrying the toner image has been laminated under the action of heat to the final receiving material, the photochemical adhesive layer is fully cured by means of UV light through the transparent carrier, and the carrier layer is then peeled off.

A further possibility is full curing and crosslinking of a photochemically reactive adhesive layer after the toner has been taken up, but before it is transferred, to such an extent that the softening and melting range of the layer is markedly above that of the toner. When pressed on under the action of heat, the entire layer is then no longer transferred, but only the toner is melted and transferred onto the final receiving material.

Accordingly, the adhesive layers which can be used advantageously are those which have a multi-ply structure with at least one more strongly adhesive layer and at least one less strongly adhesive layer, and, in the case of a multi-ply structure, the ply which is in contact with the base is less tacky. It can also be advantageous to use a multi-ply adhesive layer, the top ply of which has such a low tackiness that it is dry to the touch. An adhesive layer which is photochemically reactive or can be fully cured by photopolymerization is also advantageous.

A wide range of suitable substances is available for the adhesive layer which takes up the toner. As a rule, these are composed of a polymer, which determines the cohesion properties, and of tackifying resins. The resins can here be replaced wholly or partially by unsaturated monomers which in turn can be polymerized again.

Adhesive layers composed of a pressure-sensitive adhesive mass, such as are used in so-called pressure-sensitive adhesive tapes, have relatively little tackiness but, instead, can be used without a covering layer and are easy to handle. These have the advantage that they can be peeled off again from the photoconductor layers without leaving a residue, so that no additional release layer on the photoconductor is required. The adhesive masses are as a rule composed of about 65-75 parts by weight of rubber and resin, about 1-2 parts by weight of anti-aging agent and about 10-20 parts by weight of plasticizers. The fillers customary in this field can be incorporated only if the adhesive layer represents the final receiving material and the color image is viewed in reflection. Natural and synthetic rubber types can be used. The tackifying resin component can be composed of colophony or esters thereof. Polyterpene resins are preferred because of their oxidatin resistance. Hydrocarbon resins as well as coumarone resins, indene resins and phenol/formaldehyde resins can also be used. The softening point and the quantity used of the resin are an essential component for influencing the tackiness.

Permanently tacky contact adhesives such as are used on adhesive labels or self-adhesive decorative films, are also suitable for the process according to the invention. The raw materials used are natural and synthetic rubber types in conjunction with modified natural resins, phenol/formaldehyde resins or hydrocarbon resins. In addition to rubber, polyacrylates, polymethacrylates, polyvinyl ethers and polyisobutene types or copolymers thereof are also frequently used. The adhesive masses are applied in the form of solutions to paper or film. The solvent is then removed. Dispersion adhesives can also be used. These are predominantly composed of polyacrylates or vinyl acetate copolymers. The contact adhesive layers must be covered, until they are used, by suitable materials with a non-sticky finish, such as, for example, silicone paper or siliconized polyethylene film.

For the above-mentioned, particularly preferred embodiment of the process according to the invention, in which the multi-ply adhesive layer is a two-ply adhesive layer composed of a more strongly adhesive material and a less strongly adhesive material which is dry to the touch, hot-melt adhesives are particularly suitable. Many of the currently available hot-melt adhesives are mixtures of approximately equal parts of ethylene/vinyl acetate copolymers, which have differing contents of vinyl acetate and hence varying melt indices, and of balsamic resins or colophony derivatives, hydrocarbon resins and waxes or paraffins. Insofar as they show a certain tackiness at room temperature, they are suitable for the process according to the invention, if applied in a thin layer. In place of ethylene/vinyl acetate copolymers, low-molecular polyethylenes, atactic polypropylenes and ethylene/acrylate copolymers or copolymers containing carboxyl groups, as well as styrene/butadiene and styrene/isoprene block copolymers can also be used. Layers which contain polyamides, polyaminoamides as well as aliphatic and aromatic polyesters or fusible polyurethanes, are in principle also suitable for the process according to the invention.

As will be explained below in more detail, polyester film, preferably biaxially stretched polyester film, is used as the base for the adhesive layer. This is of advantage whenever the adhesive mass has a melting range below about 130° C. The base does not shrink during the melt transfer, and the dimension accuracy remains ensured. When two-ply adhesive layers are applied, the layer which is in direct contact with the film base or with a release layer on the film must be harder and drier to the touch than the outer adhesive layer which receives the toner. The latter layer should be composed of a superficially tacky hot-melt adhesive. A suitable selection is not difficult in view of the wide range of hotmelt adhesives available.

By contrast, photochemically reactive compositions, from which adhesive layers for the process according to the invention can be prepared, are not directly obtainable on the market. However, known formulations can be adapted. Photopolymer layers contain at least four groups of substances: a binder, a monomer, a photoinitiator and a stabilizer. The tackiness and thermal behavior are affected by the nature and content of binder and monomer.

Thermoplastic elastomers—styrene/butadiene and styrene/isoprene block copolymers being in the foreground—are preferred binders for the process according to the invention. As addition-polymerizable, ethylenically unsaturated monomers, trimethylolpropane trimethacrylate, hexanediol diacrylate and hexanediol dimethacrylate are preferred. The photoinitiators used are ketones such as ethylanthraquinone or Michler's ketone. Phenols such as 2,6-di-tert-butyl-4-methylphenol or p-methoxyphenol serve as stabilizers. Layers in thicknesses of 5–50 $\mu$m can be obtained, for example, by coating from a 50% solution in toluene and evaporation of the toluene or by melt extrusion from a slot die. A thin polyethylene or polypropylene film is necessary to prevent premature reaction with oxygen.

Photopolymerizable core positions, in which the binder has no rubber-elastic component, can also be used for the process according to the invention. Materials such as are used in reprography, for example for photomechanical production of printing forms or circuit boards, can be used after modification. Their ability for imagewise differentiation and the resulting solubility differences are admittedly of no direct importance to the process according to the invention, but they can be utilized in process variants. Light-sensitive mixtures of this type contain at least one polymerizable compound, at least one photoinitiator and at least one copolymer with at least one unsaturated carboxylic acid. Examples of photopolymerizable monomers are acrylates and methacrylates such as diglycerol diacrylate, polyethylene glycol dimethacrylate, acrylates and methacrylates of trimethylolethane, trimethylol propane and pentaerythritol and polyhydric alicyclic alcohols. With particular advantage, reaction products of diisocyanates with partial esters of polyhydric alcohols are used. A large number of substances, for example benzoins and polynuclear quinones are suitable as the photoinitiators. The copolymer is preferably composed of a terpolymer of methacrylic acid, methyl methacrylate or ethyl methacrylate and an alkyl methacrylate having 4–15 carbon atoms in the alkyl group. The tackiness and viscosity of the layers can be varied within wide limits by the monomer/binder ratio and the composition and degree of polymerization of the polymer. The layers are applied from solvents directly to the polyester base, and the solvent is evaporated off.

The dimensional accuracy must meet stringent requirements in color test systems. Thus, the length deviation of the copy from the original must be less than 1 mm per meter. The papers must have a high strength and should have a weight per unit area of not less than 200 g/m$^2$. However, papers can be used only under constant atmospheric conditions, since their longitudinal extension or shrinkage under wide variations of atmospheric humidity is greater than the indicated value. Transparent films are therefore preferably used. Because of the stress during the transfer in the roller nip, these must be composed only of materials of low deformability. Moreover, if the image is to be viewed through the film, an optically perfect quality is necessary. Biaxially stretched polyester films meet these demands and are used with preference. Depending on the size of the format and the intended use, they are employed in thicknesses of about 50–180 $\mu$m in the process according to the invention. Polycarbonate films are also suitable.

As a rule, the adhesive layers can be applied to the base without an interlayer. In some cases, however, it is advantageous to use an adhesion-promoting or release coat. Adhesion-promoting layers are preferably composed of natural or synthetic rubbers at a weight per unit area of up to 1 g/m$^2$. They are advantageous in particular in the case of soft layers since, otherwise, an extension of the adhesive film on the base can take place, without the latter also being extended, as a result of the tangential forces during the transfer. The length of the color image is thus increased in one direction. Accurate register would then no longer apply for the subsequent transfer steps. Silicones, especially polydibutylsiloxane, and polytetrafluoroethylene as well as carbamid are used as the release layer. A release layer is advisable if the process variant of a melt transfer of a thermoplastic elastomer is envisaged.

The selection of photoconductors for use in the process according to the invention is not restricted to one type. Layers of selenium and its alloys, of amorphous silicon, of zinc oxide/binder and organic photoconductor layers can in principle be used in the same way. Allowance must be made for the fact that the adhesive layer receiving the toner must not irreleasably adhere to the photoconductor and that, if the photoconductor is to be used repeatedly, the latter is not damaged by the pressure during the transfer.

In the case of inorganic photoconductor layers, chemistry allows only few possibilities of substantially varying the adhesion by the layer composition. This shortcoming can be overcome by preferential application of a thin, adhesion-reducing covering layer in a thickness of up to 1 $\mu$m, without substantially altering the other electrophotographic properties. However, as a rule, the life of the covering layer is shorter than that of the photoconductor, so that the anti-adhesive properties decrease during use. In the case of zinc oxide/binder layers, it is possible, by means of partial or entire use of silicone resins as a polymer component, to obtain a sufficient non-stick action against most adhesives.

The widest range of variation with respect to adaptation of the surface properties is provided by organic photoconductor layers, which are therefore also preferably used. A distinction must be made between layers, in which the processes of charge carrier generation and charge carrier transport take place in a homogeneous layer, and those in which the processes take place in separate layers.

Homogeneous layers are composed of a solid solution of the actual monomeric photoconductor in a polymeric binder. Examples of possible photoconductors are 2,5-bis-4'-dimethylaminophenyl-1,3,4-oxadiazole, 1,2-aryl derivatives and 2-alkyl derivatives of bis-5,2'-chlorophenyl-4,4'-diethylaminophenyloxazole or 2,4'-diethylaminophenyl-6-methyl-benzodiazole. Examples of possible binders are: copolymers of acrylates and methacrylates and styrene, and also copolymers of vinyl chloride, for example with maleic anhydride. The photoconductor content in the amorphous layers can be up to 50 percent by weight as a maximum, but is as a rule between 25 and 30 percent by weight.

Since the absorption of most of the monomeric organic photoconductors is in the near ultraviolet range, it is necessary to sensitize the layers for visible light. This can easily be accomplished by the sensitizers also known from silver halide photography, such as, for example, Astrazone Orange R (C.I. 48,040) or Brilliant Green (C.I. 42,040). The required quantity of sensitizer is as a rule less than 1 percent by weight of the total dry composition.

Photoconductor layers, in which the functions of charge carrier generation and charge carrier transport are separate, are as a rule composed of a pigment, in which charge carriers are formed after the absorption of light, and a transport layer which is composed of a photoconducting polymer or a polymer with photoconducting monomers dissolved therein. The pigments can either be dispersed in the layer or form a separate ply. Representatives of a plurality of pigment classes are known as photoconductors. Perylimide derivatives such as, for example, N,N'-dimethylperylimide or N,N'-dimethoxypropylperylimide, perinones such as Orange GR or phthalocyanines such as $\epsilon$-copper phthalocyanine, should be mentioned in particular. Bisazo pigments such as Diana Blue or Chlorodiana Blue are also frequently used. These photoconductors and binders for the above-mentioned homogeneous layers are used as the transport medium for the charge. If the pigment is dispersed in the layer, its content can be up to 60 percent by weight. The content of monomeric photoconductor can be relatively small and amount to about 5 percent by weight of the total dry composition. The overall layer thicknesses of pigmented organic photoconductors are between about 3 $\mu$m and 20 $\mu$m. If the medium generating charge carriers and the charge carrier transport are located in separate layers, the charge carrier generation layer has as a rule a thickness of about 1 $\mu$m, and the transport layer typically has a thickness of between about 4 and 20 $\mu$m. Drums of metal or two-dimensional planar materials, which have at least one electrically conducting surface, can be raised as the base for the photoconductor layers. Drums are used when the photoconductor is to be used repeatedly. It is then advisable, however, to carry out the transfer step not in the upper indicated range of pressure, but rather in the lower range. Otherwise, there is a risk of damaging the photoconductor in the case of repeated use. Aluminum foils and aluminum plates are preferably used for the two-dimensional embodiment. Their thicknesses can be in the range from less than 1 $\mu$m to 400 $\mu$m. Films, in particular polyester films, with vapor-deposited or sputtered aluminum are used in the lower range, aluminum foils laminated to plastic film or paper are used in the middle range of about 10–50 $\mu$m, and self-supporting plates are used in the upper thickness range. Advantageously, these are also surface-treated, for example by slight roughening and/or anodizing. This results in an improvement of adhesion. Since thin aluminum plates are deformed under the high transfer pressure in the process according to the invention, their use is advisable only if the base material and the photoconductor layer are so inexpensive that a separate plate can be used for each color of the separation. Aluminum-laminated paper meets these conditions. A particularly inexpensive material is obtained if a homogeneously sensitized photoconductor layer or a pigment-dispersed photoconductor layer is applied in a thickness of less than 5 $\mu$m to aluminum laminated paper.

The process according to the invention for producing color images is described by reference to the use of dry developers, i.e., dry toners. In principle, however, a liquid toner, i.e., a liquid developer, can also be used, if certain conditions are met. Thus, the deposited toner must not coagulate and form a continuous film, since the latter, after the transfer, reduces or eliminates the adhesive capacity of the receiving layer which is then located underneath. Moreover, the dispersed particles should only slightly swell in the dispersing agent or not at all, since, in that case, it would be difficult to press them into the adhesive layer. Because of the loss of dispersing agent due to evaporation, measures for protecting the environment must be taken into consideration.

Dry developers are used in the form of one-component or two-component developers. Magnetic one-component developers have only limited use for color images, since the incorporated ferro-magnetic component has a color of its own. Non-magnetic one-component developers, which are charged triboelectrically, can be used in principle but, because it is difficult to maintain constant charging, they are less suitable for demanding work. Two-component developers, which are composed of ferro-magnetic, coarse carrier particles and fine toner particles, are preferred. Toner particles, such as are used in electrophotographic office copiers, have as a rule a mean particle diameter of about 10 $\mu$m, irrespective of whether they are black or colored. In color proofing systems, however, a clean reproduction of 10 $\mu$m wide isolated lines is usual. This cannot be achieved with particles having a diameter of 10 $\mu$m. For use in the process according to the invention, the toner particles must therefore have a smaller diameter. Optimum results, adequate for practice, are obtained when the median of the particle diameter is between 3 and 5 $\mu$m. This can be achieved by means of modern grinding and screening equipment. Because of the greater surface/mass ratio as compared with conventional coarser toners, the addition of control agent must as a rule be less than in the case of coarser toners.

The adjustment of the triboelectric charging of the toner to a correct value and maintenance of the latter during use is an important characteristic for colored toners, since the color density, which depends on the quantity of the deposited toner, represents additional information content. The specific charge of the colored toners is between about 15 and 50 $\mu$C/g, preferably between 20 and 30 $\mu$C/g. Lower values lead to more extensive toner deposition, but can also have the effect that non-image areas can be slightly colored. If the charging is higher, the deposition becomes less, and fine image elements become sharper. This can be tolerated to a certain extent, since this effect can be countered by a higher charge and lower exposure of the photoconductor layer.

Dry toners for two-component developers are composed of a polymeric binder, one or more coloring components and, as a rule, one or more charge control agents. All the components have an influence on the chargeability of the toner and must therefore be selected with particular care in the case of colored toners.

The melting properties and flow properties of the toner during fixing are given essentially by the thermal properties of the polymeric binder. The polymer composition and molecular weight vary depending on the type of fixing. Fixing by hot rolls has gained wide acceptance in office copiers. In this case, the problem of so-called cold and hot offset arises. In the range of first melting, the toner becomes tacky and tends to adhere to the fixing roller (cold offset) and, at high fixing temperatures, it becomes mobile and its cohesion and surface tension decrease, so that, again, wetting of the roller can occur. In order to retain the widest possible range of this process parameter, polymers of special composition, in particular of defined molecular weight and defined molecular weight distribution, are used. These are frequently characterized by great inhomogeneity and, in many cases, even have 2 maxima of the molecular weight distribution. Thus, for example, a particularly advantageous and frequently used polymer has an $M_w$ of 133,000 and an $M_n$ of 13,500, a first molecular weight maximum being at 20,000 and a second being at 400,000.

Binders of this type can also be used in the process according to the invention, in particular if the melt transfer variant is applied.

Examples of known binders for dry toners are styrene/acrylate copolymers, styrene/acrylonitrile copolymers or styrene/butadiene copolymers. Epoxy resins of the bisphenol type are also used. Polyester resins also show good properties in use. The softening point of the toner polymers is usually between about 110° and 180° C. It is desirable that the glass transition temperature is about 50°-80° C. If it is lower, the toner can cake, and if it is higher, the fixing temperature is in most cases too high.

The triboelectric properties of most of the polymers suitable for toner production are not very pronounced. In the majority of cases, weak negative charging is observed on polymers, comminuted to toner size, without further additives in combination with the commercially available carrier particles. Tailor-made adjustment of the charging is possible by incorporation of functional groups such as—COOH or —NH$_2$, as is described, for example in U.S. Pat. No. 3,985,664 and U.S. Pat. No. 4,049,477.

Colored pigments, such as are employed as coloring agents for toners and are also used in the process according to the invention, almost always show by themselves a triboelectric effect. It is an applicable rule that substances with NR$_3$ or NR$_4$+ groups lead to positive charging and those with, for example, COOH, SO$_3$H, CONR$_2$ and SO$_2$NR$_2$ groups lead to negative charging. A further rule is that substances having electron acceptor properties represent potentially negative control agents, and those having donor properties represent potentially positive control agents. The triboelectric properties change in combination with the above-mentioned toner polymers. It is frequently observed that a pigment incorporated into the polymer cannot exert its charging tendency. Sometimes, however, there is a very strong influence. It follows that, in the selection of coloring agents for colored toners, not only the coloristic aspects but also their triboelectric effect on the toner particles must be taken into account.

Suitable pigments for colored toners are to be found amongst the known dye groups of the dioxazines, phthalocyanines, perylenes, quinacridones, azo pigments and laked azo pigments. Representatives of the nigrosins, triphenylmethane coloring agents, cationic coloring agents and chromium complexes can in some cases be used as additives in the adaptation of color shade and control.

Examples of coloring agents are organic chromium-containing compounds, such as acetoacetic acid monoazo yellow pigments based on arylamide (fast yellow series, for example C.I. Pigment Yellow 1, 3, 74, 97 and 98), acetoacetic acid diazo yellow pigments on arylamide bases (such as, for example, C.I. Pigment Yellow 12, 13 and 14), yellow dyes (such as, for example, C.I. Solvent Yellow 12, 19, 77 and 79 and C.I. Disperse Yellow 164), red or scarlet pigments (such as, for example, C.I. Pigment Red 48, 49, 1.53, 1.57, 57, 1, 81, 122 and 5), and colors on a red base (such as, for example, C.I. Solution Red 49, 52, 58 and 8), pigments on a blue base (such as copper phthalocyanine and its derivatives, such as, for example, C.I. Pigment Blue 15:3) and green pigments (such as C.I. Pigment Green 7 and 36). C.I. means the constitution number which is used in the Color Index, 3rd edition (1971, London) for identification of the dyes.

More stringent requirements with respect to the correct selection of the pigments result from the fact that color proofing methods are intended to lead to a color image which, as far as possible, is not distinguishable from a print. Since the color stimulus specifications for color prints are narrowly fixed (standard chromaticities according to European and U.S. Standards) and certain commercially available pigments meet these requirements, it is obvious to search for suitable ones from their range for use in electrophotographic toners and to optimize the toners therewith. The following were found to be suitable: for yellow, Permanent Yellow DHG (C.I. Pigment Yellow 12), Permanent Yellow GR (C.I. Pigment Yellow 13), Permanent Yellow GG 02 (PY 17) and Novotherm Yellow HR (PY 83) and mixtures thereof. These diazo pigments introduce a strongly negative triboelectric component. For cyan: Hostaperm Blue B2G and Hostaperm Blue B3G from the group of the phthalocyanines. These pigments also have a negatively controlling action. For magenta: Permanent Ruby L6B (C.I. 15,850:1), Permanent Ruby F6B (PR 184), mixtures of Hostaperm Rosa E (PR 122) and Permanent Carmine FBBO2 (PR 146). Permanent Ruby 6B introduces a negatively controlling component, and the other pigments control positively. For the black component, conventional toners are used, in which carbon black and nigrosin produce the coloration.

An appropriate carrier must be used in the fine-particled toner, such as is preferably used in the process according to the invention. In principle, all products industrially used for this purpose can be employed, such as powders of iron, manganese, nickel, cobalt or chromium, or those of iron alloys or of ferro-magnetic oxides such as ferrites and magnetites. Their surface area should be as large as possible. This is the case with fractured, spongy or plate-like structures. RZ tips (Mannesmann AG), which are formed by spraying of molten iron and rapid quenching, are particularly suitable. With these, it is ensured that toner in a concentration of up to about 5 percent by weight, relative to the carrier, does not form multi-ply layers on the carrier, since this leads to nonuniform and inadequate charging of the toner. The particle diameters of the carrier material are approximately between 70 and 200 μm.

An important component in the dry developer is the control agent for the toner, which serves to set the triboelectric chargeability. In the case of conventional black toners, nigrosin types are preferably used for this purpose. Since, however, these are themselves colored dark, they cannot be used as control agents for colored toners. Control agents effecting colorless positive charging are to be found amongst the organic polyvalent metal compounds. Calcium stearate and zinc stearate as well as sodium oleate are to be mentioned as typical representatives. Zinc salts of polycarboxylic acids are also effective. These are highly impact-resistant and are therefore difficult to incorporate into other polymers. They make the toner harder, so that it penetrates more easily into the adhesive mass during the transfer. Colorless control agents suitable for colored toners and based on organic boron compounds are described in German Offenlegungsschrift No. 3,707,303, corresponding to British Pat. No. 2,189,036.

The process according to the invention for producing color images comprises the following steps:
producing a latent charge image of the color separation (the latter is as a rule screened) of a colored original,
developing the charge image with a toner in the corresponding color,
transferring the toner image with pressure onto a two-dimensional adhesive layer, and
repeating these steps with the further color separations.

The adhesive layer with the toners can then, as described above in detail, be further processed by various methods. The electronic charging and exposing takes place in accordance with the known state of the art and can be carried out in the devices known for this purpose. Because of the requisite accuracy, preferably those devices are employed as are known for the production of offset printing plates by electrophotographic means. These operate either with optical imaging via a lens or with scanning laser exposure. The photoconductor layers to be processed therein are either of an organic nature or are composed of zinc oxide in a binder. The bases are also two-dimensional and planar, and aluminum in sheet form is used in most cases. Aluminum-laminated paper can also be used.

In the reprocameras used for the production of offset printing plates by electrophotographic means, the intensities in the imaging plane amount to a few $\mu W/cm^2$. Since the photoconductor layers of the above-mentioned type require between 10 and 30 $\mu J/cm^2$ for full exposure, the resulting exposure times for producing a latent charge image are between 10 and 30 seconds. Allowing for the required transport steps and the developing process, 1–2 plates can be produced per minute in this way. In the case of a four-color separation, a complete color image can thus be formed every 2–4 minutes, when such a camera is used. This is a shorter time than that usual in the conventional photochemically operating processes.

It is also possible to make images of transparent color separators by contact exposure on the photoconductor layer. The exposure times then become even shorter. However, the overall process cannot be significantly accelerated thereby, since the further process steps can hardly be carried out faster than above, without loss in quality.

The imagewise exposure can advantageously also be carried out in a laser exposure apparatus, such as is described in EP-A 0,000,048, corresponding to U.S. Pat. No. 4,149,798.

This operates with a 16 mW argon ion laser at a wavelength of 488 nm.

For developing the individual charge images with the corresponding colored toners, the known magnetic brush development is advantageously applied. This guarantees high image sharpness, uniform toner deposition and high constancy.

Figure 2:
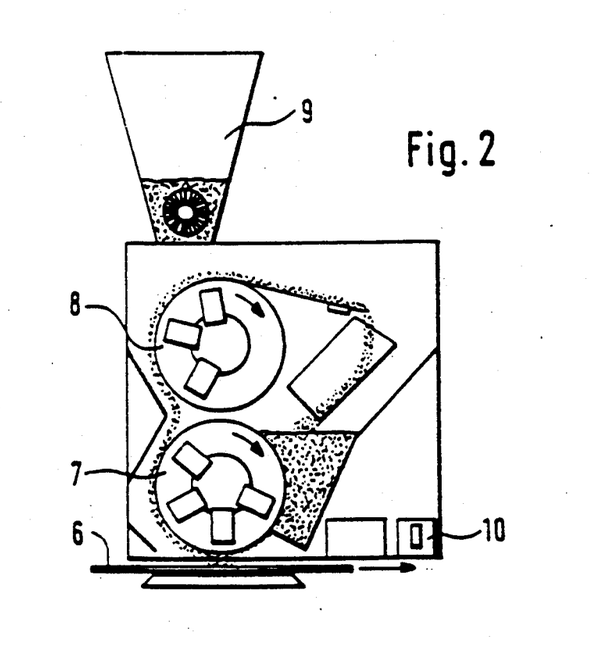
FIG. 2 is a developing unit useful in practicing a preferred embodiment of the present invention.

With particular advantage, a developing unit is used for this purpose, such as is described in German Offenlegungsschrift No. 2,658,792 and is diagrammatically shown in FIG. 2. In this unit, the developer is provided from above to the plane photoconductor layer which is to be developed and carries charge images. This layer is marked 6 in FIG. 2. The element 7 represents the magnetic roll, by means of which the developer is applied. The roller 8, located above the former, serves to transport the developer upwards, so that the latter is provided with a dropping height for mixing. On top of this, a replenishing unit 9 is located, from which fresh toner can be metered in accordance with the toner consumption. Any ferromagnetic carrier which may have been moved out with the plate is taken off by a magnetic strip 10.

Developing speeds of 0.5-5 m/minute are possible. Owing to the compact construction of the device, developing widths of up to 1 m are feasible. One developer unit is provided for each color. These can be arranged closely behind one another or above one another. Depending on the color separation, the corresponding developer unit&: must then be brought into contact with the photoconductor layer carrying the latent charge image.

Figure 3:
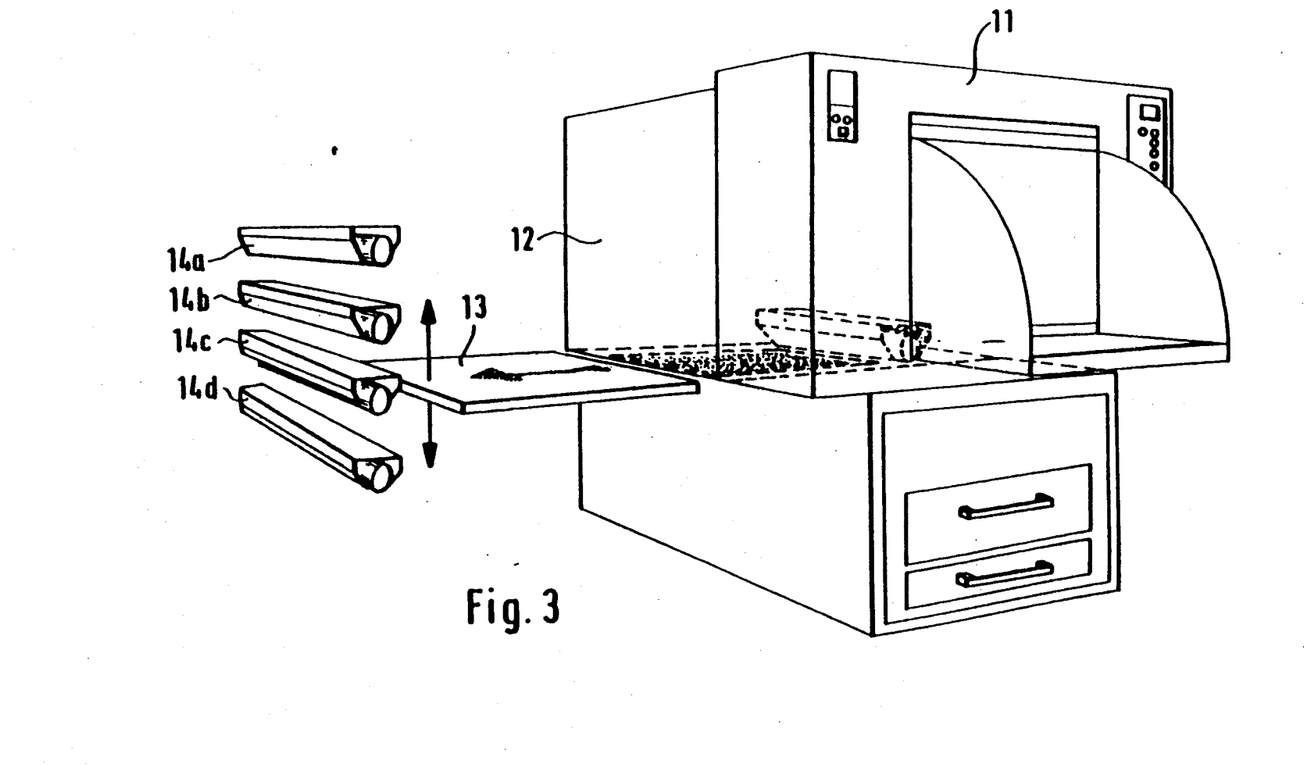
FIG. 3 is an arrangement of developing units in a preferred embodiment of the present invention.

A preferred embodiment, in which the individual developer units are arranged one above the other, is shown in FIG. 3. In the latter, the camera part and developing part of a commercially available automatic machine for processing electrophotographic flexographic printing plates is shown. The charging part and optical part, by means of which the latent charge image is produced, are located in the constructional unit 11. The plate then migrates into the constructional element 12, in which development normally takes place with black toner. The plate then moves into the fixing and developing part. For the production of color separation images, the as yet undeveloped plate with the latent charge image is pushed onto the lifting table 13. The latter then moves in front of the corresponding developing part (14a, 14b, 14c or 14d) and the plate is passed through underneath the latter. For the sake of clarity, the housing is not shown.

In the preceding considerations, it had always been assumed that the color separations are positive and are also to be developed positively. Frequently, however, there is a case of negative originals having to be processed to give positive color images. This is also possible by the process according to the invention. If, for example, the layer is negatively charged, positively charged toner deposits in the image areas. In order to prevent deposition of toner in the non-image areas, a voltage which is somewhat higher than the residual voltage of the latent image is applied to the magnetic brush (counter-voltage). In order to obtain relatively identical potential conditions under converse light/dark conditions, the plate is positively charged. When the magnetic brush is brought to a positive voltage corresponding to the image area potential, a positively charged toner is applied to the discharged areas. By contrast, the charged image areas do not accept any toner, because of the identity of the potential with that of the brush. When negatively charged toner is used, the polarities correspondingly have to be applied conversely.

The following procedure is used in order to obtain the necessary registering between the tacky receiving material and the photoconductor layer carrying the toner image: the first transfer is carried out without exact registering. The register crosses present on every color separation are also copied. Holes are then punched into the receiving material directly on the transferred register crosses or at a defined distance. The further procedure is then carried out in the same way, but the register holes are then punched directly into the plates which carry the further toner images of the color separation. The holes of the receiving material and the holes in each of the individual plates are then brought into a position one above the other by means of pins. In this way, both opaque and transparent materials can be processed in the same way in true register. If a transparent base is used for the adhesive layer, it is in principle also possible visually to bring the register crosses above one another. However, since the toner is not yet resistant to wiping and the receiving layer is tacky, registering is as a rule more difficult to accomplish than in the case of using pins.

In the case of very large formats, it is advisable to make register holes not only on the front edge, but also on one side edge, but not too far away from the front edge.

In another embodiment of the process, holes are punched immediately into the receiving material and the latter, on pins, is suspended on a drum. The latter advantageously has the circumference of the length of the receiving sheet. The plate with the toner image can then be clamped to the counter-cylinder as in a printing press. In this case, it is necessary, in the same way as in printing, to ensure that the fixing holes are at a defined distance from the register crosses. Since the said cameras are designed in their precision for the production of multicolor plates and the plates themselves are cut at exactly right angles, this requirement can be met.

The layer pack, comprising the photoconductor to which toner has been applied (with base) and the adhesive layer (with base) is then passed into the roller nip of the print transfer device described further above. It is advantageous to use a feed plate with a feed edge for the layer pack and, upstream of the actual pair of printing rollers, to provide a pair of rollers of soft material, by means of which the layer pack is guided. It is also advantageous not to close the pair of printing rollers until the leading edge of the layer pack has run in.

As the final step, the toner image is preferably transferred together with the adhesive layer, but without the base material thereof, to the final receiving material. This is as a rule the printing paper of the printed product which is to be simulated. The transfer is preferably effected by heat with an adhesive layer which, as described further above, must have teat-sealing properties. For this purpose, a large number of devices can be used which otherwise serve for laminating heat-sealable adhesive films. The preferred devices to be used are those which serve for laminating photoresist layers to circuit boards, since these, because of the high quality of the products processed thereon, have perfect track guidance and good temperature constancy. Advantageously, the working temperature is kept below 125° C. At this temperature, the polyester film preferably used as the carrier does not yet show any shrinking behavior. The above-mentioned laminating devices are also equipped for winding up a peeled-off film. In the case of the process according to the invention, this can be the film which originally carried the adhesive layer, or the carrier film of a covering layer. The flood-lighting step required when a photopolymerizable layer is used can be carried out with UV light sources, such as are conventional in reprography for the exposure of printing plates or blueprint papers.

The invention is described in more detail by reference to the examples which follow, without restricting it thereto.

EXAMPLE 1

The photoconductor layer of the following composition was prepared:
  100 parts by weight of a copolymer of n-hexyl methacrylate, styrene, methacrylic acid and acrylic acid (42:12:21:25 mol percent), 80 parts by weight of 2,5-bis-(4'-diethylaminophenyl)-1,3,4-oxadiazole, 1 part by weight of Astrazon Orange G (C.I. 48,035) and 0 0.1 part at weight of Rhodamin FB (C.I. 45,170).

The thickness of the photoconductor layer was 4 μm, and an anodized aluminum plate of 100 μm thickness was used as the base.

A set of four colored toners was prepared as follows: a polymer obtained from 70 percent by weight of styrene and 30 percent by weight of butyl methacrylate, having a molecular weight of 30,000, was used. In each case, 90 parts by weight thereof were separately mixed and extruded with, respectively, 10 parts by weight of Permanent Yellow GG 02, Hostaperm Rosa E, Hostaperm Blue BL2G and, in each case, 1 percent by weight of sodium oleate in addition. For the black toner, 90 parts by weight of the polymer were mixed with 10 parts by weight of Raven 1020 carbon black and 2.5 parts by weight of Nigrosin, and extruded. The toner melts were crushed, ground and extruded in the conventional manner. In all four cases, the mean of the toner particle diameter was adjusted to 4 μm. RZ chips in the particle range from 80 to 100 μm were used as the toner carrier. The toner content was adjusted in each case to 3 percent by weight.

The adhesive receiving material used was a 170 μm thick, clear polyester film on which there was a 10 μm thick layer of a mixture of 60 parts by weight of polyterpene resin and 40 parts by weight of Hypalon ® (chlorosulfonated polyethylene).

An electrophotographic camera of EA 692 type (manufactured by Hoechst AG) was used for charging, exposing and developing the photoconductor layer. The original used was a four-part set of a four-color test original. The photoconductor layer was charged to −400 V and then exposed for 20 seconds. For development in the individual colors, in each case the mechanical developing part was operated with the toner of the corresponding color, as shown diagrammatically in FIG. 3. The set of four plates, thus obtained, with the dry toner images in different colors was then successively transferred to the polyester film provided with the adhesive layer. This was carried out in the sequence black, cyan, magenta and yellow. For this purpose, a roller fixing device made by Hitachi and having a working width of 30 cm was used. The pressure was set to 100 N/cm. 100% toner transfer was obtained in all cases. The passage speed was 2 m/minute.

The transferred toner chalked only a little, and the layer was almost non-tacky. In order to obtain copy for viewing in reflection, the toner image was then rolled onto a paper which in turn had been provided with the safe adhesive layer as the receiving material.

The four-color copy obtained in this way shows a perfect image up to the 40's screen. Its color reproduction corresponds largely to the original.

EXAMPLE 2

In order to obtain a positive color copy from a set of color separations of negative originals, the procedure as in Example 1 was followed, with the difference that the layer was not charged negatively, but positively to 350 V.

During the development, a voltage of +200 V was applied to the magnetic brush.

The reproduction quality of the color copy obtained was comparable with that produced with the corresponding set of positive originals.

EXAMPLE 3

The photoconductor layer used was a pigment dispersion layer. The latter is composed of 62 percent by weight of Orange GR (C.I. 71,105, Pigment Orange 43, VAT Orange 7, CAS 4424-06-0), 33 percent by weight of a polymer obtained from 60 percent by weight of n-hexyl methacrylate, 35 percent by weight of methacrylic acid and 5 percent by weight of styrene as well as 5 percent by weight of 2,5-bis-(4'-diethylaminophenyl)-1,3,4-oxadiazole. The layer weight was adjusted to 5 g/m².

A non-linear polyester resin was used as the binder for the set of colored toners. This resin was prepared according to Preparation Example 1 of German Offenlegungsschrift No. 3,709,535. The resin has a glass transition temperature of 70° C. and a softening point of 145° C. The pigments used were Permanent Yellow GR, Permanent Carmine FBO1 and Hostaperm Blue BL2G. The coloring component for the black toner was carbon black. In each case, 5 percent by weight of the said pigments were incorporated in the resin, and the toner was prepared from this in the known manner. The toners were screened to give mean particle diameters of 5 μm. The toners are of themselves negatively charged and show a specific charge of between 15 and 35 μC/g, if 2 percent by weight thereof are mixed in the dry developer with an RZ type carrier.

The adhesive receiving material used was a layer which can be fully cured photochemically. This layer was composed of 85 percent by weight of Cariflex TR 1107 (block copolymer of 15% styrene and 85% of isoprene), 10 percent by weight of hexanediol dimethacrylate, 1.5 percent by weight of benzophenone and 0.5 percent by weight of 4-hydroxy-3,5-di-tertbutyltoluene. The adhesive layer was applied in a thickness of 30 μm from a 50% solution in toluene to 125 μm thick polyester film.

The photoconductor layer was charged, exposed and developed in a laser exposure device such as is described in EP-A 0,000,048. The original used was a four-color separation on opaque paper. The individual color separations were successively scanned linearly by a focussed laser beam. A 1 mW helium/neon laser beam was used for this purpose. Exposure was carried out by means of a 10 mW argon/ion laser which was modulated in the phases of the light/dark information from the reading laser and which emits at a wavelength of 488 nm. The scanning speed was 300 lines/second, and the scanning density was 40 lines/mm. The laser beam was focussed to 50 μm both during scanning and during exposure. The light output of the argon/ion laser on the plate was determined to be 650 μW. This gives an energy absorption of the photoconductor layer of from 11 to 15 μJ/cm². The laser exposure device contains an integrated developer unit as shown in FIG. 2. In this unit, the photoconductor layer carrying the latent charge image is provided from above with the developer mixture. The advancing speed of the photoconductor plate was set to 1.5 m/minute. The developer mixtures in the individual colors were successively put into the mechanical developing part.

The transfer to the tacky receiving material was carried out as described in Example 1.

The adhesive layer carrying four colors was then laminated at 125° C. to a calendered paper of 100 g/m² weight per unit area. The adhesive mass was exposed for 1 minute to UV exposure through the film. It was then possible to peel off the carrier layer.

This resulted in a multi-colored image on which even extremely small details were clearly discernible.

EXAMPLE 4

A two-layered photoconductor was used. This contained, as the base, a polyester film on which aluminum had been vapor-deposited. A 0.2 μm thick layer of N,N,-dimethylperylimide was directly applied to the film and, on top thereof, a 15 μm thick transport layer which was composed of 60 parts by weight of 2,5-bis-(4'-diethylaminophenyl)-1,3,4-oxadiazole and 40 parts by weight of high-viscosity nitrocellulose. This layer was charged negatively.

For developing, the four-color toner set of Example 1 was used.

The adhesive layer was composed of a mixture of 6.5 parts by weight of a copolymer obtained from 30 parts by weight of methacrylic acid, 60 parts by weight of n-hexyl methacrylate and 10 parts by weight of styrene, and 5.6 parts by weight of a monomer which was obtained by reacting 1 mol of 2,2,4-trimethylhexamethylene diisocyanate and 2 mol of hydroxyethyl methacrylate, and 1 part by weight of triethylene glycol dimethacrylate, 0.2 part by weight of Michler's ketone and 0.2 part by weight of benzophenone. The mass was applied in a thickness of 25 μm to a 50 μm polyester film.

The four color separations, the photoconductor film and the receiving material were conjointly provided with register holes before further processing.

The photoconductor layer was charged to −400 V in a continuous charging apparatus in a dark room. The exposure was carried out in a copying frame provided with appropriate register pins. The film carrying the latent charge image was then placed upon a plane surface and held thereon by suction. A developing unit with toner application from above was then moved over it. In each case, the toner corresponding to the separation was used for development. The photoconductor film was then clamped to a drum by means of two clamping strips. The film with the adhesive layer is applied in the same way to a counter-pressure roller. The rollers were then pressed against one another while running synchronously, the transfer taking place. The photoconductor layer was then freed of residual toner by means of a rotating brush, and the next image was copied thereon and further processed as in the first step.

What is claimed is:

1. A process for producing screened color images electrophotographically for the color proofing method by means of toner image transfer, which comprises the steps of
   (a) providing an adhesive material comprising a base and a multi-ply adhesive layer with at least one more strongly adhering layer and at least one less strongly adhering layer, (b) transferring a plurality of toner images of different colors successively from a photoconductor to said adhesive layer with application of pressure by a pair of rollers exerting a linear pressure in the range from about 10 N/cm to 200 N/cm,
   (c) transferring said adhesive layer together with said plurality of toners of different colors adhering thereto to a final receiving material, and
   (d) peeling off said base from said adhesive layer.

2. The process as claimed in claim 1, wherein said adhesive layer comprises a pressure-sensitive adhesive mass, a contact adhesive or a hot-melt adhesive.

3. The process as claimed in claim 1, wherein said adhesive layer has a thickness of about 4–40 μm.

4. The process as claimed in claim 1, wherein said adhesive layer is a multi-ply adhesive layer of which the ply in contact with the base is the least tacky.

5. The process as claimed in claim 1, wherein said adhesive layer is a multi-ply adhesive layer of which the tackiness of the top ply is sufficiently low that said ply is dry to the touch.

6. The process as claimed in claims 1, wherein said adhesive layer is photochemically reactive.

7. The process as claimed in claim 1, wherein said adhesive layer is fully curable by photopolymerization.

8. The process as claimed in claim 1, wherein said base is a transparent two-dimensional base.

9. The process as claimed in claim 1, wherein said adhesive material further comprises a release layer between said base and said adhesive layer.

10. The process as claimed in claim 1, wherein said adhesive material is an adhesive film which comprises a polyester film base.

11. The process as claimed in claim 1, wherein said adhesive layer together with said plurality of toners of different colors adhering thereto is transferred by means of heat to said final receiving material.

12. The process as claimed in claim 1, further comprising the step of fully curing said adhesive layer by exposure to UV radiation.

13. The process as claimed in claim 1, further comprising the steps of providing a plurality of screened color separations of a color image, exposing said photoconductor imagewise under each of said plurality of screened color separations to produce a corresponding latent charge image, and developing each of said latent charge images, using a toner which is dyed in a standard color for multi-color printing, to produce said plurality of toner images.

14. The process as claimed in claim 1, wherein said final receiving material is a paper sheet for multi-color printing.

15. The process as claimed in claim 1, wherein said photoconductor carries a thin, adhesion-reducing top layer.

16. A color image produced using the process of claim 1.

* * * * *